United States Patent
Huang et al.

(10) Patent No.: US 7,517,550 B2
(45) Date of Patent: Apr. 14, 2009

(54) METHODS OF MAKING COMBINATIONAL STRUCTURES FOR ELECTRO-LUMINESCENT DISPLAYS

(75) Inventors: Wei-Pang Huang, Hsinchu (TW); Yi-Fan Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 11/939,189

(22) Filed: Nov. 13, 2007

(65) Prior Publication Data

US 2008/0064134 A1 Mar. 13, 2008

Related U.S. Application Data

(62) Division of application No. 10/856,456, filed on May 28, 2004, now Pat. No. 7,315,118.

(51) Int. Cl.
   B05D 5/00 (2006.01)
   B05D 5/06 (2006.01)
   H01J 1/62 (2006.01)
(52) U.S. Cl. .............. 427/66; 427/68; 216/72; 438/34; 438/35; 313/483; 313/498; 313/506; 313/509
(58) Field of Classification Search .......... 216/23, 216/37, 52, 72; 427/58, 64, 66–68, 77; 438/34, 438/35, 689, 694, 758, 759, 761, 778, 787; 313/483, 498, 506, 509, 512
See application file for complete search history.

(56) References Cited

U.S. PATENT DOCUMENTS

| 6,492,190 | B2 | 12/2002 | Yamanaka et al. |
| 6,528,820 | B1 | 3/2003 | Yamazaki et al. |
| 6,531,713 | B1 | 3/2003 | Yamazaki |
| 6,555,422 | B1 | 4/2003 | Yamazaki et al. |
| 6,582,980 | B2 | 6/2003 | Feldman et al. |
| 6,597,121 | B2 | 7/2003 | Imura |
| 6,639,574 | B2 | 10/2003 | Scheibe |
| 6,639,605 | B2 | 10/2003 | Van Dalfsen et al. |
| 2002/0097350 | A1 | 7/2002 | Haven et al. |
| 2004/0195963 | A1 | 10/2004 | Choi et al. |
| 2005/0153058 | A1* | 7/2005 | Tachikawa et al. ............ 427/66 |
| 2005/0249972 | A1 | 11/2005 | Hatwar et al. |

FOREIGN PATENT DOCUMENTS

| CN | 1635821 | 7/2005 |
| JP | 10-289785 | 10/1998 |
| TW | 466466 | 12/2001 |
| TW | 523930 | 3/2003 |

* cited by examiner

Primary Examiner—Michael Kornakov
Assistant Examiner—Francis P Smith
(74) Attorney, Agent, or Firm—Duane Morris LLP

(57) ABSTRACT

A picture element for an electro-luminescent display comprises a substrate, a first intermediate structure disposed above a first area of the substrate, at least one first color type electro-luminescent device disposed above the first intermediate structure, a second intermediate structure disposed above a second area of the substrate, and at least one second color type electro-luminescent device disposed above the second intermediate structure. The second intermediate structure is different from the first intermediate structure.

11 Claims, 8 Drawing Sheets

Efficiency and C.I.E (cd/A)

| | R | G | B |
|---|---|---|---|
| First Intermediate Structure | 4.3 (0.626, 0.372) | 8.25 (0.287, 0.656) | 4.03 (0.177, 0.184) |
| Second Intermediate Structure | 6.16 (0.645, 0.354) | 8.416 (0.242, 0.668) | 4.85 (0.196, 0.221) |

FIG. 6

Efficiency and C.I.E

| Primary color | x | y | Efficiency(cd/A) |
|---|---|---|---|
| Red (second intermediate structure) | 0.645 | 0.354 | 6.16 |
| Green (second intermediate structure) | 0.242 | 0.668 | 8.41 |
| Blue (first intermediate structure) | 0.177 | 0.184 | 4.03 |

METHODS OF MAKING COMBINATIONAL STRUCTURES FOR ELECTRO-LUMINESCENT DISPLAYS

CROSS-REFERENCE TO RELATED APPLICATIONS

This is a divisional application of co-pending U.S. non-provisional patent application Ser. No. 10/856,456, filed May 28, 2004, now U.S. Pat. No. 7,315,118, by Wei-Pang Huang, et al., titled Combinatorial Structures for Electroluminescent Displays, the entirety of which patent is incorporated by reference herein.

FIELD OF THE INVENTION

The present invention relates to electro-luminescent displays, and more particularly to combinational structures for electro-luminescent displays and a method to manufacture the above displays.

BACKGROUND

Flat display technology has been significantly advanced recently, in part because manufacturing thin film transistors on a substrate such as glass has become a mature skill. This facilitates the development of active matrix type display devices. In addition to liquid crystal materials, which need a backlight when used for flat displays, an electro-luminescent device, such as an organic light emitting diode (OLED), which can emit light itself, is actively researched. The feature of self-light-emission is one of the reasons that the display comprising electro-luminescent devices is brighter than a backlit liquid crystal display.

FIG. 1 is a schematic diagram of a conventional electro-luminescent display panel using OLEDs. The OLED panel comprises a data driving circuit, a scan driving circuit, a plurality of scanning lines G1 and G2, a plurality of data lines D1-D6 crossing the scanning lines to form a plurality of pixel regions P1-P12, a plurality of switching thin-film-transistors (TFT) S1-S12, a plurality of pixel driving TFT T1-T12, and a plurality of OLEDs R1, G1, B1 through R4, G4, B4. OLEDs R1, R2, R3, and R4 emit red light. OLEDs G1, G2, G3, and G4 emit green light. OLEDs B1, B2, B3, and B4 emit blue light.

Each pixel region P1-P12 comprises a TFT area and an OLED area. The TFT area includes a switching TFT and a pixel driving TFT. Conventionally, all OLED areas have the same structure regardless of the color of light emitted by OLEDs. FIG. 2 shows the structure of an OLED area. An OLED 290 is disposed above an intermediate structure 250 which is disposed above a substrate 200. The OLED 290 comprises at least an anode, such as an indium tin oxide (ITO) layer 260, an organic light emitting layer 270, and a cathode layer 280. The intermediate structure 250 includes a passivation layer 240, an interlayer dielectric (ILD) 230, a gate oxide layer 220, a silicon oxide layer ($SiO_x$) 215, and a silicon nitride layer ($SiN_x$) 210.

When a current is applied to the ITO (anode) layer 260 and the cathode layer 280, light emitted from the organic light emitting layer 270 is transmitted toward the bottom direction through the ITO layer 260, the intermediate structure 250 and the substrate 200. However, the intermediate structure 250 has different optical effects (such as absorption, transmission, and reflection) on light of different colors including red, green, and blue. Therefore, a specific same intermediate structure may have a better optical effect on blue light that on red light and/or green light. As a result, the color saturation and transmission rate of an OLED panel is not optimized.

SUMMARY OF THE INVENTION

In some embodiments, a picture element for an electro-luminescent display comprises a substrate, a first intermediate structure disposed above a first area of the substrate, at least one first color type electro-luminescent device disposed above the first intermediate structure, a second intermediate structure disposed above a second area of the substrate, and at least one second color type electro-luminescent device disposed above the second intermediate structure. The second intermediate structure is different from the first intermediate structure. In some embodiments, a method to manufacture the above-mentioned picture element is provided.

BRIEF DESCRIPTION OF THE DRAWINGS

A more complete understanding of the present invention can be obtained by reference to the detailed description of embodiments in conjunction with the accompanying drawings, in which:

FIG. 6 is a table of efficiency and C.I.E. value of red, green, and blue color in an OLED display using solely either the first intermediate structure or the second intermediate structure;

FIG. 7 is a table of efficiency and C.I.E. value of red, green, and blue color in an OLED display using a combination of the first intermediate structure and the second intermediate structure.

DETAILED DESCRIPTION

Figure 1:
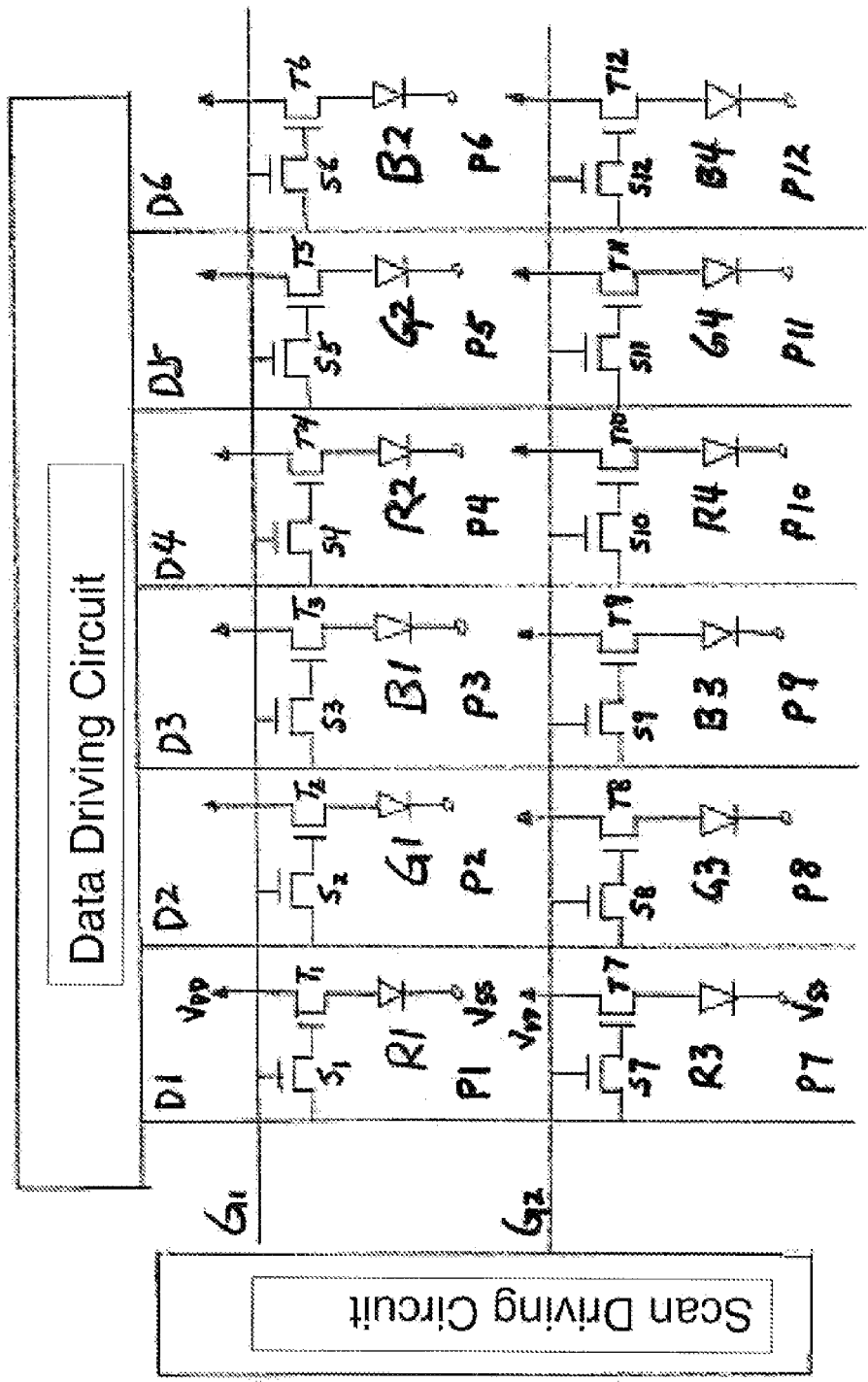
FIG. 1 is a schematic diagram of a conventional electro-luminescent display panel using organic light emitting diodes.
Figure 2:
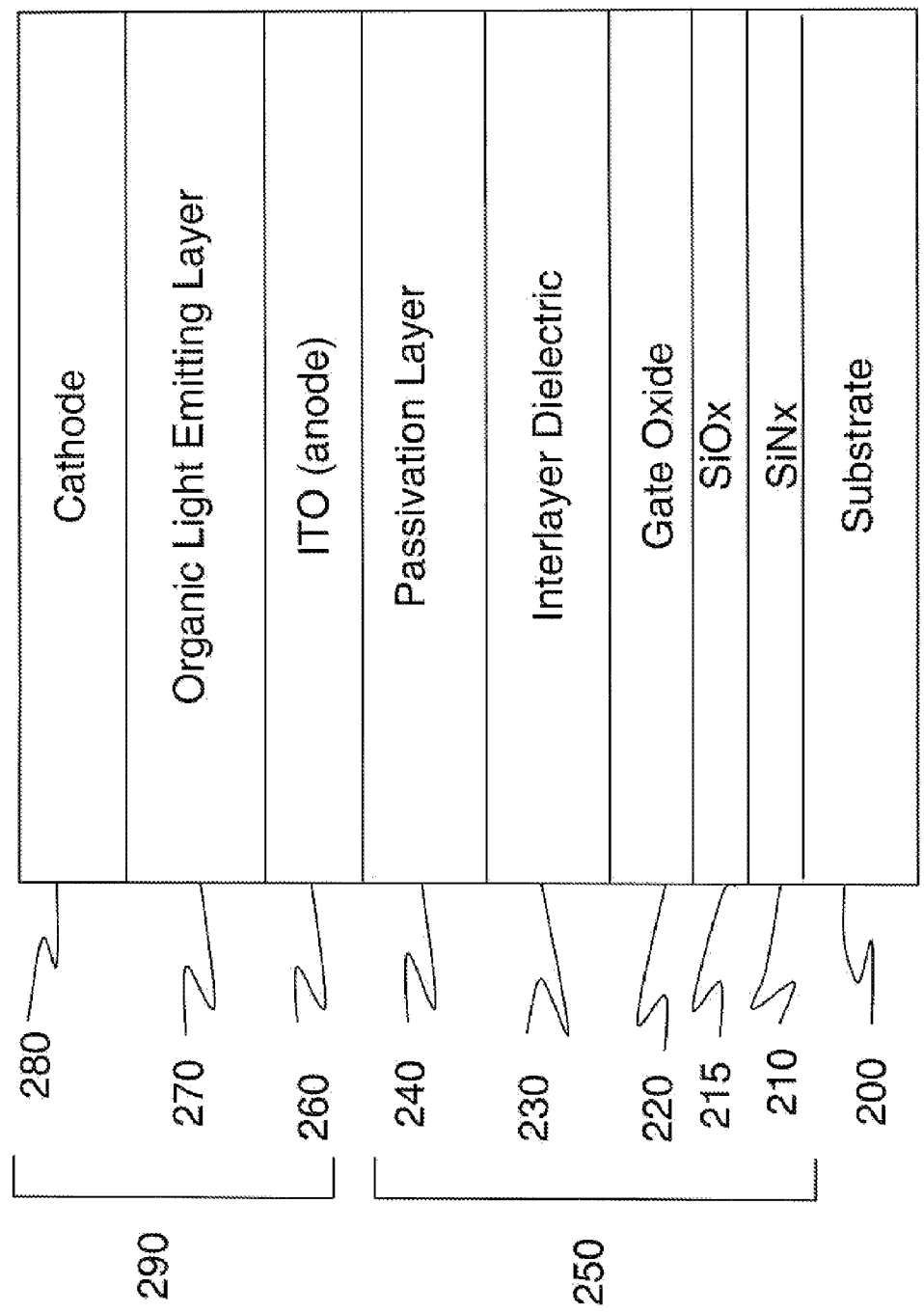
FIG. 2 illustrates a cross-sectional view of a conventional OLED area.
Figure 3:
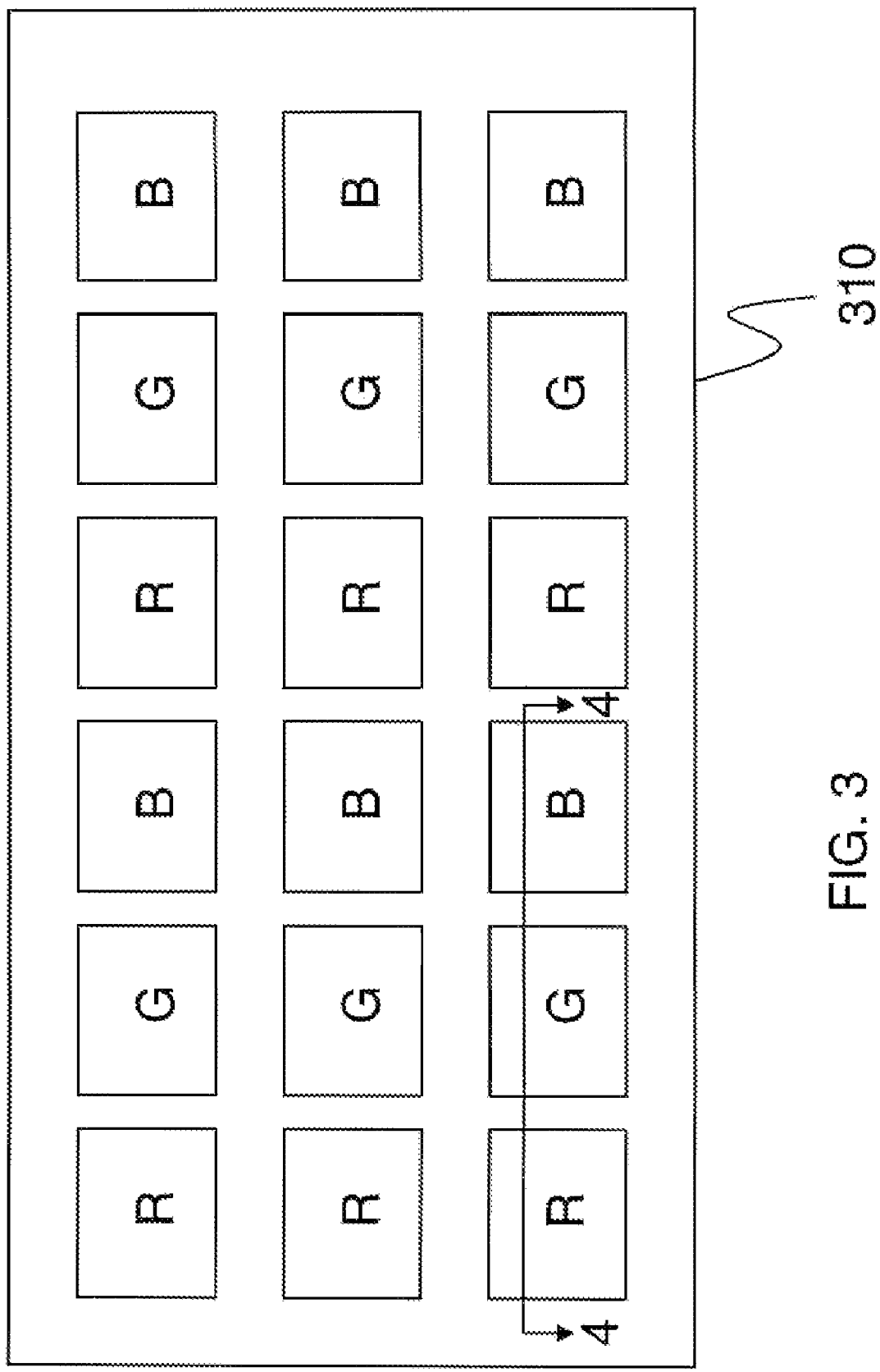
FIG. 3 illustrates an exemplary embodiment of a picture element of an electro-luminescent display.
Figure 4:
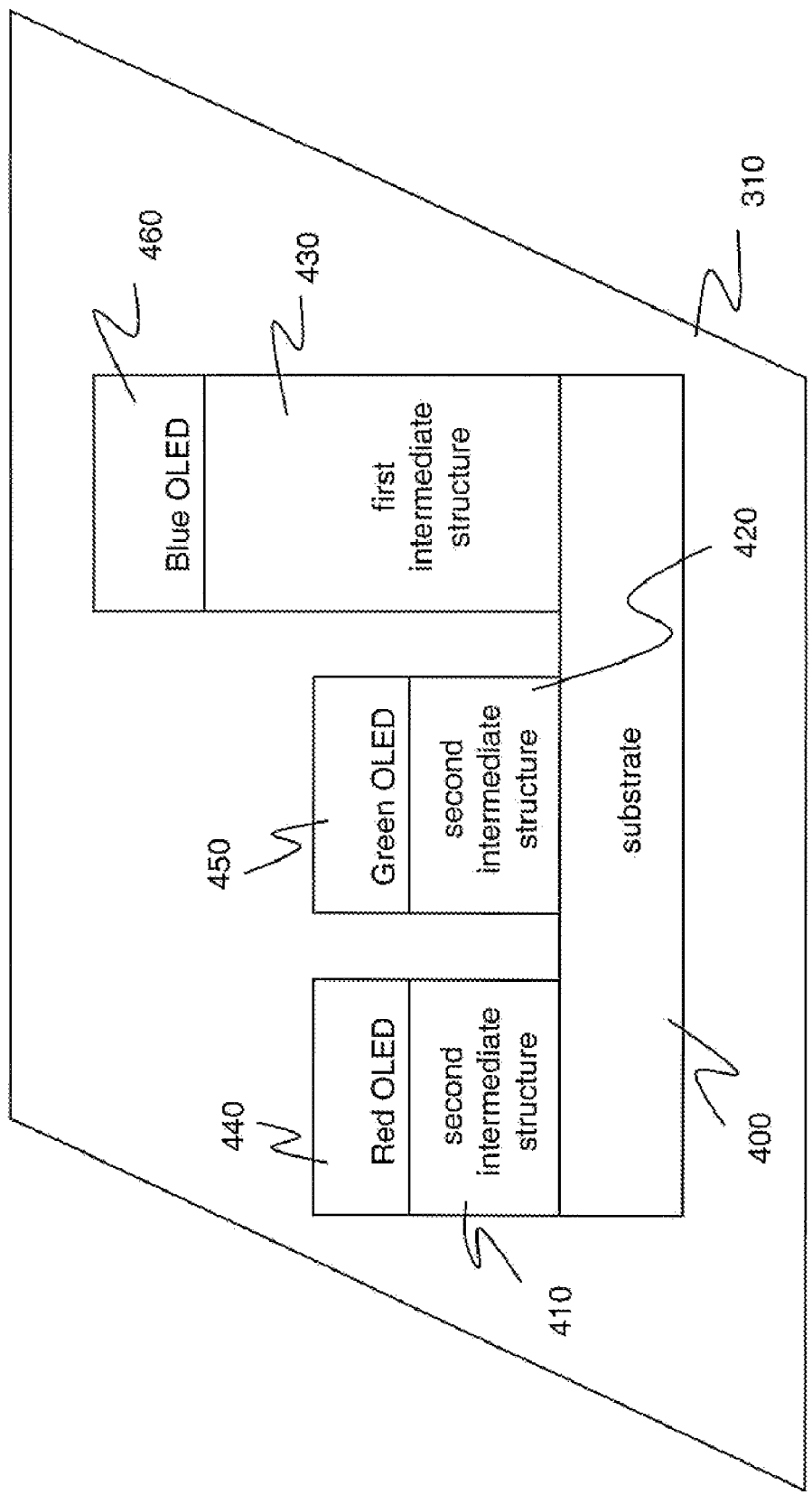
FIG. 4 illustrates a cross-sectional view along the line 4-4 of the picture element shown in FIG. 3.

FIG. 3 shows an exemplary embodiment of a picture element 310 of an electro-luminescent display. Organic light emitting diodes (OLEDs) are used as light emitting devices in the electro-luminescent display. The picture element 310 comprises an area arranged with red, green, and blue light OLEDs. FIG. 4 is a cross-sectional view of the adjacent red, green, and blue light OLEDs along section line 4-4 as shown in FIG. 3. A first intermediate structure 430 is disposed above a first area of a substrate 400. A blue color OLED 460 is disposed above the first intermediate structure 430. A second intermediate structure 410 and 420 is disposed above a second area of the substrate 400. A red color OLED 440 is disposed above the second intermediate structure 410. A green color OLED 450 is disposed above the second intermediate structure 420. The second intermediate structure 410 and 420 is different from the first intermediate structure 430.

Figure 5A:
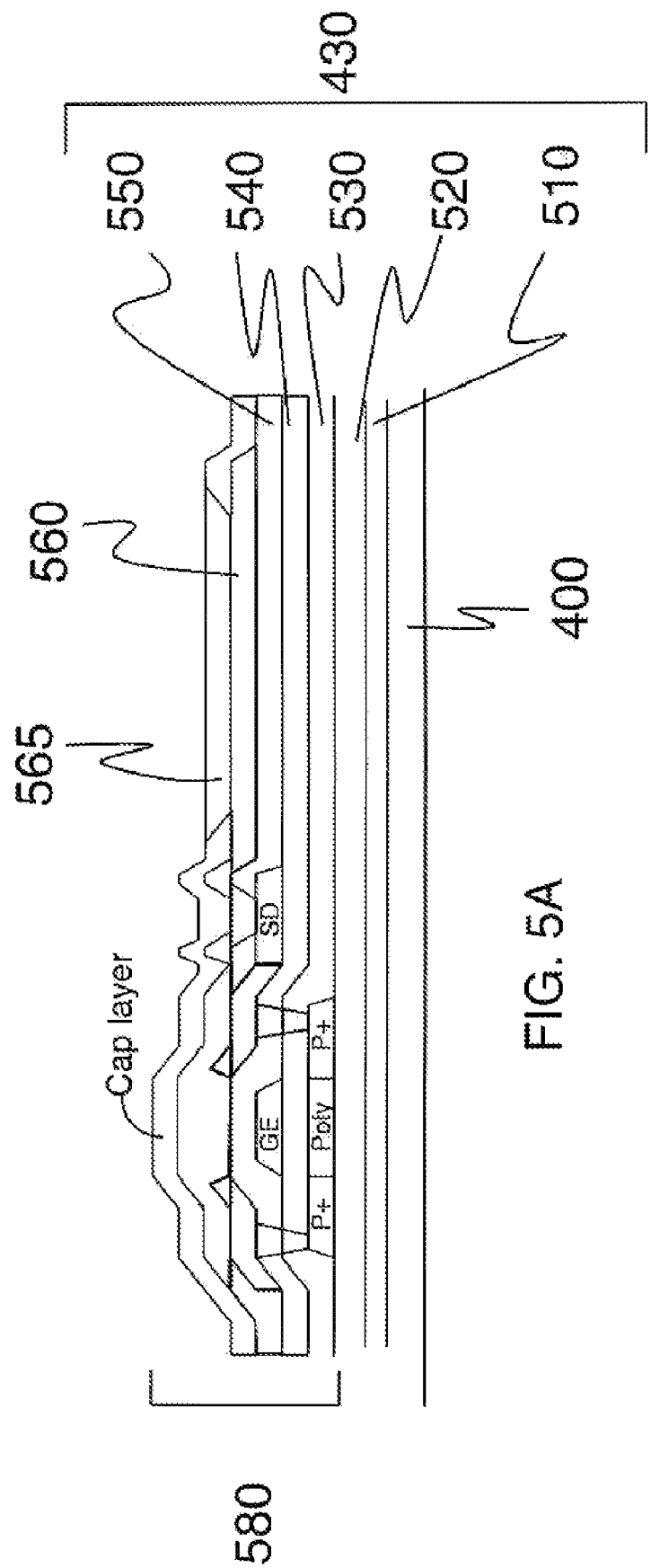
FIG. 5A illustrates a cross-sectional view of a first intermediate structure.

In FIG. 5A, the first intermediate structure 430 is disposed above the substrate 400. The substrate 400 can, for example, comprise amorphous silicon and/or poly silicon. The first intermediate structure 430 contains a first intermediate layer and a second intermediate layer. The first intermediate layer includes a first buffer layer 510, a second buffer layer 520, and the second intermediate layer includes a gate oxide layer 530, a dielectric layer 540, and a passivation layer 550. The first buffer layer 510 which may comprise silicon nitride ($SiN_x$), a second buffer layer 520 which may comprise silicon oxide ($SiO_x$), a gate oxide layer 530, a dielectric layer 540, and a passivation layer 550. The first buffer layer 510, which may be deposited by chemical vapor deposition (CVD) has a thickness ranging from approximately 400 to approximately 600 angstroms. The second buffer layer 520 deposited by chemical vapor deposition has a thickness ranging from approximately 1400 to approximately 1600 angstroms. The gate oxide layer 530 can be deposited by chemical vapor deposition and has a thickness ranging from approximately 900 to approximately 1100 angstroms. The dielectric layer 540 can be deposited by chemical vapor deposition and has a thickness ranging from approximately 2800 to approximately 3200 angstroms. The passivation layer 550 can be deposited by chemical vapor deposition and has a thickness ranging from approximately 2800 to approximately 3200 angstroms. The passivation layer can comprise silicon nitride ($SiN_x$), silicon oxide ($SiO_x$), or organic photo resist. An ITO layer 560 is disposed above the first intermediate structure 430. An organic light emitting layer 565 for emitting blue light is deposited above the ITO layer 560. A pixel driving TFT 580 is used to drive the blue light OLED 460 to emit light.

Figure 5B:
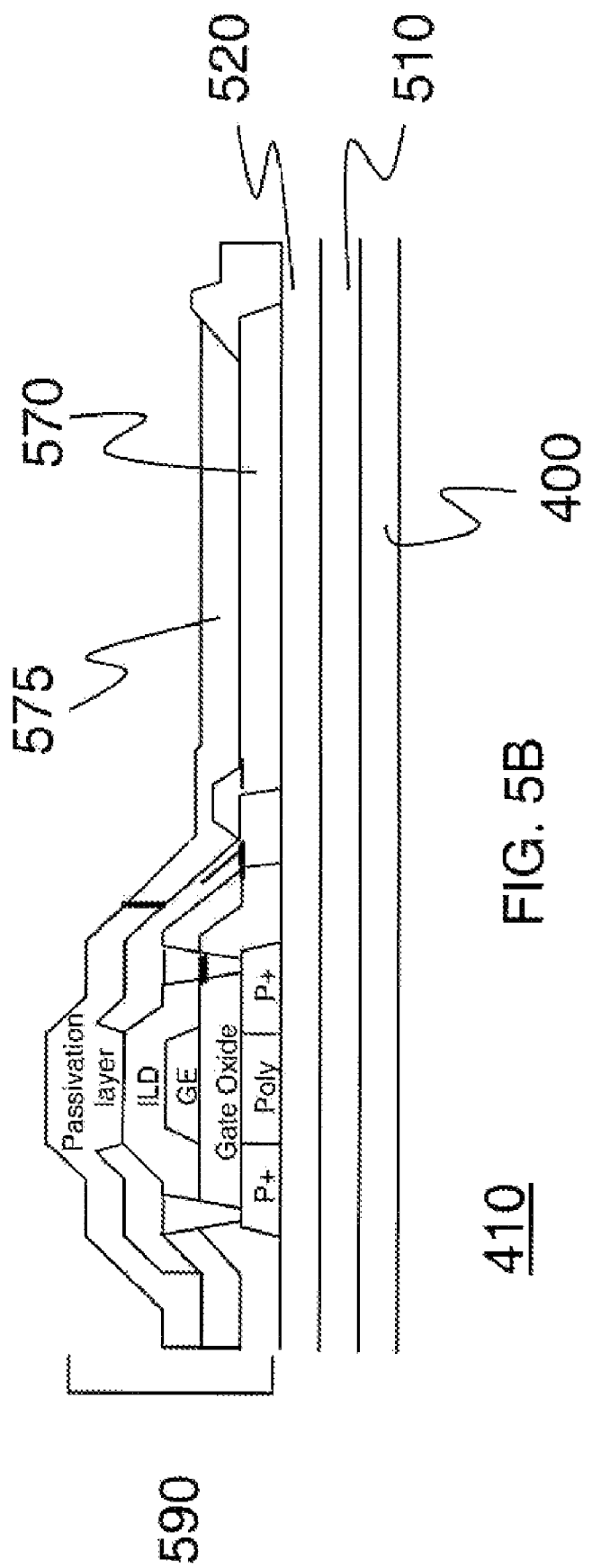
FIG. 5B illustrates a cross-sectional view of a second intermediate structure.

In FIG. 5B, the second intermediate structure 410 is disposed above the substrate 400. The second intermediate structure 410 contains a first intermediate layer including a first buffer layer 510 which may comprise silicon nitride ($SiN_x$) and a second buffer 520 which may comprise silicon oxide ($SiO_x$). The first buffer layer 510 can be deposited by chemical vapor deposition and has a thickness ranging from approximately 400 to approximately 600 angstroms. The second buffer layer 520 can be deposited by chemical vapor deposition and has a thickness ranging from approximately 1400 to approximately 1600 angstroms. An ITO layer 570 is disposed above the second intermediate structure 410. An organic light emitting layer for emitting red light 575 is deposited above the ITO layer 570. A pixel driving TFT 590 is used to drive the red light OLED to emit light.

In another embodiment (not shown), each of the red, green, and blue light OLEDs can be disposed above a different type of intermediate structure to increase the color saturation of a display panel. Accordingly three different intermediate structures may be used in a single picture element. One of ordinary skill in the art will appreciate different combination of various intermediate structures for red, green, and blue color electro-luminescent devices such as OLEDs.

FIG. 6 shows the efficiency and C.I.E. value of red, green, and blue color in an OLED display using solely either the first intermediate structure 430 or the second intermediate structure 410. The color saturation (primary color/NTSC) using only the first intermediate structure 430 is 61%. The color saturation (primary color/NTSC) using only the second intermediate structure 410, 420 is also 61%.

Color saturation represents how pure a color is. A display panel with good color saturation can display subtle color changes distinctly. As a result, the human eye can perceive close colors as being different from one another. An image with low saturation appears washed-out, faded, and gray. In contrast, a high saturation color is a vivid, pure color of a given hue. The C.I.E. value is measured by the standards published by the International Commission on Illumination.

FIG. 7 shows the efficiency and C.I.E. value of red, green, and blue color in an OLED display using a combination of the first intermediate structure 430 and the second intermediate structure 410. The color saturation (primary color/NTSC) of using combined structures is 68% when the red and green OLEDs use the second intermediate structure 410, 420 and the blue OLED uses the first intermediate structure 430.

An exemplary method is now described, to manufacture the picture element 310 with a combination of the first intermediate structure 430 and the second intermediate structure 410 and 420. Each layer is formed on both the first area and the second area. Then unwanted layers are removed from the second area. The first buffer layer 510 is formed over both the first area and the second area above the substrate 400. The second buffer layer 520 is then formed over both the first area and the second area above the first buffer layer 510. The gate oxide layer 530, the dielectric layer 540, and the passivation layer 550, are sequentially formed above both the first area and the second area. The passivation layer above the second area is etched. The dielectric layer above the second area is etched. The gate oxide layer above the second area is etched. The red and green color type OLED are formed above the second area above the second buffer layer 520. The blue color type OLED is formed over the first area above the passivation layer 540.

Another embodiment of a method to manufacture the picture element 310 with a combination of the first intermediate structure 430 and the second intermediate structure 410 and 420 is now described. Each layer is formed only on the area(s) for which that layer is desired. The first buffer layer 510 is formed on both the first area and the second area above the substrate 400. The second buffer layer 520 is then formed on both the first area and the second area above the first buffer layer 510. The gate oxide layer 530, the dielectric layer 540, and the passivation layer 550, are sequentially formed only on the first area. The red and green color type OLEDs are formed over the second area above the second buffer layer 520. The blue color type OLED is formed over the first area above the passivation layer 540.

Although the exemplary embodiments include a particular first intermediate structure and an exemplary second intermediate structure, one of ordinary skill in the art can readily construct other first intermediate structures optimized for one type (e.g., blue) of OLED and/or other types second intermediate structures optimized for another type (e.g., green and/or red) of OLED.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of manufacturing a picture element for an electro-luminescent display, comprising:

forming a first buffer layer on both a first area and a second area above a substrate;

forming a second buffer layer on both the first area and the second area above the first buffer layer;

forming a gate oxide layer on both the first area and the second area above the second buffer layer;

forming a dielectric layer on both the first area and the second area above the gate oxide layer;

forming a passivation layer on both the first area and the second area above the dielectric layer;

etching the passivation layer on the second area;

etching the dielectric layer on the second area;

etching the gate oxide layer on the second area;

forming at least one first color type electro-luminescent device disposed above the passivation layer on the first area; and forming at least one second color type electro-luminescent device disposed above the second buffer layer on the second area.

2. The method of claim 1, wherein the first buffer layer is made of silicon nitride and the second buffer layer is made of silicon oxide.

3. The method of claim 1, wherein the first color type electro-luminescent device is a blue light organic light emitting diode.

4. The method of claim 3, wherein the blue light organic light emitting diode comprises:
an anode disposed above the passivation layer;
at least one organic light emitting layer disposed above the anode; and
a cathode disposed above the organic light emitting layer.

5. The method of claim 4, wherein the anode comprises indium tin oxide.

6. The method of claim 1, wherein the second color type electro-luminescent device is a green light or red light organic light emitting diode.

7. The method of claim 6, wherein the green light or red light organic light emitting diode comprises:
an anode disposed above the second buffer layer;
at least one organic light emitting layer disposed above the anode; and
a cathode disposed above the organic light emitting layer.

8. The method of claim 7, wherein the anode of the green or red light organic light emitting diode comprises indium tin oxide.

9. The method of claim 1, wherein the substrate is a transparent substrate.

10. A method of manufacturing a picture element for an electro-luminescent display, comprising:
forming first and second buffer layers over first and second areas above a substrate;
forming a gate oxide layer over the first and second areas above the second buffer layer;
forming a dielectric layer over the first and second areas above the gate oxide layer;
forming a passivation layer over the first and second areas above the dielectric layer;
etching the passivation layer, the dielectric layer, and the gate oxide layer over the second area only;
forming a blue color type electro-luminescent device disposed above the passivation layer on the first area; and
forming a red or green color type electro-luminescent device disposed above the second buffer layer on the second area.

11. The method of claim 10, wherein the blue color type electro-luminescent device comprises a blue light organic light emitting diode comprising:
an anode disposed above the passivation layer;
an organic light emitting layer disposed above the anode; and
a cathode disposed above the organic light emitting layer; and
wherein the red or green color type electro-luminescent device comprises a red or green light organic light emitting diode comprising:
an anode disposed above the second buffer layer;
an organic light emitting layer disposed above the anode; and
a cathode disposed above the organic light emitting layer.

* * * * *